(12) United States Patent
Menezo et al.

(10) Patent No.: US 10,459,163 B2
(45) Date of Patent: Oct. 29, 2019

(54) PHOTONIC CHIP WITH FOLDING OF OPTICAL PATH AND INTEGRATED COLLIMATION STRUCTURE

(71) Applicant: COMMISSARIAT À L'ÉNERGIE ATOMIQUE ET AUX ÉNERGIES ALTERNATIVES, Paris (FR)

(72) Inventors: Sylvie Menezo, Voiron (FR); Salim Boutami, Grenoble (FR); Bruno Mourey, Coublevie (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/202,682

(22) Filed: Nov. 28, 2018

(65) Prior Publication Data

US 2019/0170937 A1   Jun. 6, 2019

(30) Foreign Application Priority Data

Dec. 6, 2017   (FR) ..................... 17 61723

(51) Int. Cl.
   *G02B 6/13*   (2006.01)
   *H01S 5/18*   (2006.01)
   (Continued)

(52) U.S. Cl.
   CPC ......... *G02B 6/124* (2013.01); *G02B 6/12004* (2013.01); *G02B 6/13* (2013.01);
   (Continued)

(58) Field of Classification Search
   CPC ..................... G02B 6/124; G02B 6/13; G02B 2006/12107; G02B 2006/12147;
   (Continued)

(56) References Cited

U.S. PATENT DOCUMENTS

| 8,315,287 B1 | 11/2012 | Roggero et al. |
| 8,515,217 B2 | 8/2013 | Bemasconi et al. |

(Continued)

OTHER PUBLICATIONS

Chen et al., "Apodized Waveguide Grating Couplers for Efficient Coupling to Optical Fibers", IEEE Photonics Technology Letters, vol. 22, No. 15, Aug. 1, 2010, pp. 1156-1158.

(Continued)

*Primary Examiner* — Akm E Ullah
(74) *Attorney, Agent, or Firm* — Pearne & Gordon LLP

(57) ABSTRACT

A photonic chip comprising a light guiding layer supported by a substrate and covered with an encapsulation layer. The chip has a front face on the side of the encapsulation layer and a back face on the side of the substrate. The light guiding layer includes a light guiding structure optically coupled to a vertical coupler configured to receive light from the waveguide and to form a light beam directed towards either the front face or the back face. The chip also comprises a collimation structure formed at least partly in the light guiding layer and an arrangement of one or several reflecting structures each on either the front face or on the back face. This arrangement is made so as to assure propagation of light between the vertical coupler and the collimation structure along an optical path with at least one fold.

11 Claims, 8 Drawing Sheets

(51) Int. Cl.
*G02B 6/124* (2006.01)
*G02B 6/30* (2006.01)
*G02B 6/42* (2006.01)
*G02B 6/12* (2006.01)
*G02B 6/136* (2006.01)

(52) U.S. Cl.
CPC ............ *G02B 6/136* (2013.01); *G02B 6/30* (2013.01); *G02B 6/4206* (2013.01); *H01S 5/18* (2013.01); *G02B 2006/12104* (2013.01); *G02B 2006/12107* (2013.01); *G02B 2006/12147* (2013.01)

(58) Field of Classification Search
CPC ............ G02B 2006/12104; G02B 6/30; G02B 6/4206; G02B 6/12004; H01S 5/18
USPC .......................................................... 385/14
See application file for complete search history.

(56) References Cited

U.S. PATENT DOCUMENTS

| | | | | |
|---|---|---|---|---|
| 9,042,691 | B2* | 5/2015 | Kang | G02B 6/34 385/14 |
| 9,091,827 | B2* | 7/2015 | Verslegers | G02B 5/1861 |
| 9,128,241 | B2* | 9/2015 | Baets | G02B 6/29326 |
| 9,285,554 | B2* | 3/2016 | Doany | G02B 6/124 |
| 9,331,096 | B2* | 5/2016 | Pinguet | H01L 21/84 |
| 9,389,378 | B2* | 7/2016 | Mack | G02B 6/4286 |
| 9,453,969 | B2* | 9/2016 | Kobyakov | G02B 6/305 |
| 9,482,816 | B2* | 11/2016 | Van Campenhout | G02B 6/124 |
| 9,575,253 | B2* | 2/2017 | Verslegers | G02B 5/1861 |
| 9,874,693 | B2* | 1/2018 | Baiocco | G02B 6/13 |
| 2002/0003824 | A1 | 1/2002 | Lo et al. | |
| 2004/0165637 | A1 | 8/2004 | Bullington et al. | |
| 2010/0141612 | A1 | 6/2010 | Desieres et al. | |
| 2015/0285737 | A1 | 10/2015 | Gliere et al. | |
| 2016/0091676 | A1 | 3/2016 | Favreau et al. | |
| 2016/0164613 | A1 | 8/2016 | Menezo et al. | |
| 2016/0299292 | A1 | 10/2016 | Hassan et al. | |
| 2017/0059754 | A1 | 3/2017 | Frey et al. | |
| 2017/0097301 | A1 | 4/2017 | Lefebvre et al. | |
| 2017/0102323 | A1 | 4/2017 | Boutami et al. | |
| 2018/0039024 | A1 | 2/2018 | Boutami et al. | |
| 2018/0204974 | A1 | 7/2018 | Boutami et al. | |
| 2018/0212399 | A1 | 7/2018 | Menezo et al. | |
| 2018/0335566 | A1 | 11/2018 | Menezo et al. | |
| 2018/0335568 | A1 | 11/2018 | Hassan et al. | |
| 2019/0011261 | A1 | 1/2019 | Taurel et al. | |
| 2019/0018197 | A1 | 1/2019 | Boutami et al. | |
| 2019/0064632 | A1 | 2/2019 | Hassan et al. | |
| 2019/0094467 | A1 | 3/2019 | Hassan et al. | |
| 2019/0113446 | A1 | 4/2019 | Boutami et al. | |
| 2019/0120755 | A1 | 4/2019 | Boutami et al. | |

OTHER PUBLICATIONS

Bernabe et al., "On-Board Silicon Photonics-Based Transceivers With 1-Tb/s Capacity", in IEEE Transactions on Components, Packaging and Manufacturing Technology, vol. 6, n°7, Jul. 2016, pp. 1018-1025.

Suzuki et al., "Cost-Effective Optical Sub-Assembly Using Lens-Integrated Surface-Emitting Laser", Journal of Lightwave Technology, vol. 34, No. 2, Jan. 15, 2016, pp. 358-364.

Preliminary French Search Report for Application No. 1761723, dated Jul. 31, 2018.

* cited by examiner

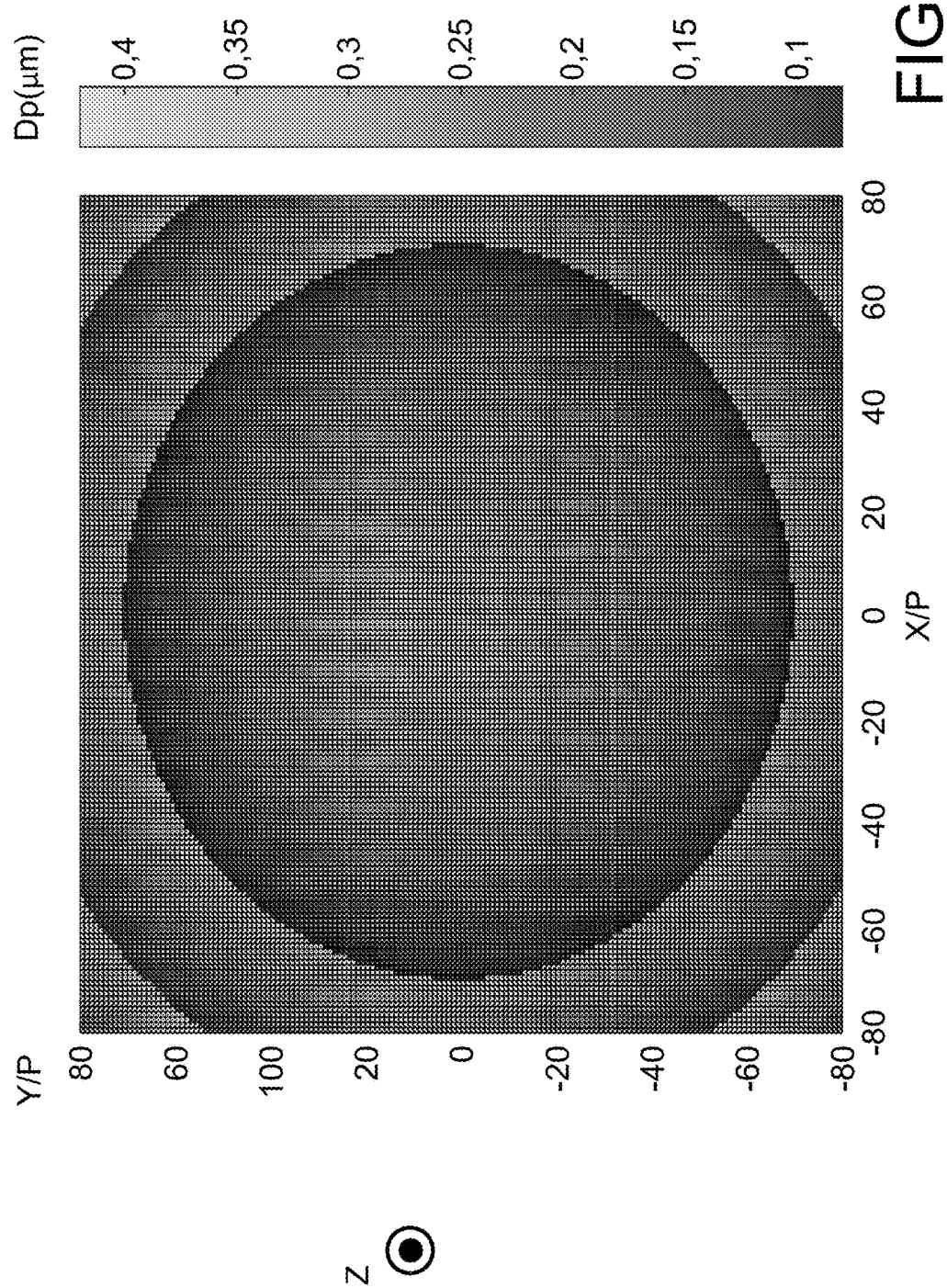

PHOTONIC CHIP WITH FOLDING OF OPTICAL PATH AND INTEGRATED COLLIMATION STRUCTURE

CROSS-REFERENCE TO RELATED APPLICATIONS

This application claims priority from French Patent Application No. 1761723 filed on Dec. 6, 2017. The content of this application is incorporated herein by reference in its entirety.

TECHNICAL DOMAIN

The field of the invention is integrated photonics on chip or integrated circuit. The invention relates to a photonic chip provided with input(s) to/output(s) from the chip, to light beams with a widened mode size for coupling with an external device, for example with another photonic chip, an optical fibre or a set of optical fibres, or for reception/emission of a light beam in free propagation.

STATE OF PRIOR ART

A "Photonic Integrated Circuit" comprises several components interconnected with each other by light waveguides. Since the photonic circuit is generally required to communicate with the outside world, it must be possible to inject light into or to extract light from the circuit in the form of an unguided light beam.

Two types of vertical couplers are routinely used to be able to inject light into or to extract light from a photonic integrated circuit perpendicular to the plane of the chip, namely surface grating couplers and solutions involving angle shift at the output from the chip.

Surface Grating Coupler

A surface grating coupler is used firstly to adapt the size of the optical mode propagating in waveguides of the photonic chip to the size of the optical mode propagating in standard monomode fibres, in other words a diameter of 9.2 µm, and secondly to change from guided propagation in the plane of the photonic chip to propagation in free space quasi-vertical to the plane of the chip. This is achieved by etching a grating in the layer containing the waveguides. For example, such a component is for instance described in: "Apodized Waveguide Grating Couplers for Efficient Coupling to Optical Fibers", IEEE PHOTONICS TECHNOLOGY LETTERS, VOL. 22, No. 15, Aug. 1, 2010, be Xia Chen et alter.

With the silicon technology, this component can thus couple light from a waveguide in the plane of the photonic chip to a cleaved single-mode fibre at an angle from the vertical, usually about 8°. The losses of this component are 1 to 4 dB optical when the geometric alignment between the surface grating coupler and the single-mode fibre is optimal. The grating-fibre alignment tolerance, characterised as the radial misalignment between the optical alignment that generates 1 dB of additional losses, is about 2 µm.

In order to increase the alignment tolerance between the surface grating coupler and an optical fibre and thus make alignment operations less complex and particularly so that they can be made using less expensive passive alignment techniques, the paper by S. Bernabé et al., "On-Board Silicon Photonics-Based Transceivers With 1-Tb/s Capacity", in IEEE Transactions on Components, Packaging and Manufacturing Technology, vol. 6, No. 7, July 2016, discloses the use of a system with two lenses composed of a first lens fixed to the photonic chip (so that that beam can be widened and collimated at the input to/output from the chip) and a second lens fixed to the optical fibre. The first lens must be very precisely aligned with the photonic chip, and then fixed to it. The alignment tolerance between the chip+first lens assembly and the second lens+fibre assembly is then increased to +/−10 to 20 µm. In order to widen and collimate a light beam with wavelength $\lambda$ and mode size $Do=2*wo=9.2$ µm at the output from the surface grating coupler, the focal length in air of the first lens must be equal to $Fair=Di. (\pi. wo/2\lambda)$, where Di is the size of the widened beam at the output from the first lens. To obtain a mode size Di of 100 µm, a silica glass lens must have a thickness of about 860 µm. Although this system can reduce the strict alignment constraints between the chip+first lens assembly and the fibre+second lens assembly, it has the disadvantage that it transfers alignment constraints between the first lens and the photonic chip to a precision of less than 1 µm. Furthermore, although extracting a larger size collimated beam increases the alignment tolerance of the chip with an opto-mechanical part facing the face of the chip, the angular reception tolerance is reduced.

Solutions by Angle Shift at the Output from the Chip

In JLT 2016, Vol. 34, No. 2, Jan. 15, 2016, Suzuki et al. disclosed the use of faceting of the waveguide at 45° covered with a total mirror to reflect a light beam perpendicularly to the back face of the photonic chip. This vertical coupler is subsequently called "faceting of the waveguide". At the back face, since the beam is very divergent or is unsuitable for the mode size of the fibre, it is proposed that a lens can be integrated onto the back face of the chip. In this implementation, the thickness through which the beam passes between the faceted guide and the lens on the back face is about 100 µm which represents the potential focus of the lens. The surface of this lens has a continuously varying thickness. The profile of this surface is thus qualified as analogue. Fabrication of such an analogue profile by etching makes use of a resin creep lithography technology or "Grey tone" lithography that has the disadvantage that is difficult to calibrate to obtain the required analogue shapes. Furthermore, such lenses must be covered by anti-reflection layers due to Fresnel reflections at the interface between the lens (index=3.5) and air (index=1). However, anti-reflection treatments are particularly fragile in hot/humid media (85° C./85% humidity), which requires the use of hermetic packaging.

Another example of integration of a lens in a photonic chip on the path of a beam from/to a vertical coupler is given in patent U.S. Pat. No. 8,515,217 B2.

In a first alternative of this patent, the lens is positioned on the front face of the chip, facing a surface grating coupler that emits towards the front face. In being integrated on the front face, the lens thus has a focal length potentially equal to the distance between the lens and the surface grating coupler. If this lens is to be integrated into the photonic chip and not placed elsewhere with the alignment constraint described above, the lens must be made in the encapsulation layer through which the beam passes on the coupler/lens path, which is usually only a few microns. However, a thickness of more than 400 µm of $SiO_2$ would be necessary to change from a mode size at the output from the coupler equal to 9.2 µm to a mode size at the output from the lens equal to 55 µm. Therefore this variant cannot provide a beam with a widened mode size. Moreover, fabrication of the lens on the front face has the disadvantage of requiring additional fabrication steps after fabrication of the photonic chip, above the photonic chip while the top of the photonic chip generally contains metal interconnection lines of photonic components with external electronic circuits.

In a second embodiment of this patent, the lens is positioned on the back face, facing a waveguide terminating by an inclined facet covered by a mirror (called a "faceted waveguide" in the following), and orienting the beam towards the back face of the chip. This implementation and its limitations are described above.

In a third alternative of this patent, the lens is positioned in the layer comprising the waveguides. However no practical implementation of this alternative is described, and particularly no implementation to widen the mode size of the beam at the output from a vertical coupler.

The lenses used in patent U.S. Pat. No. 8,515,217 B2 are analogue lenses called Fresnel lenses. A Fresnel lens replaces the curved surface of a conventional lens by a series of concentric rings with prismatic sections different from one ring to another. Therefore the thickness of a Fresnel lens is less than the thickness of a conventional lens, but it is still difficult to fabricate. It requires a sawtooth analogue structure such that peaks with variable inclinations can be defined, usually made using the "Grey tone" lithography technique. Such a Fresnel lens also remains sensitive to Fresnel reflections. Finally, such a lens is sensitive to polarisation of light due to the rings. The electric field of the optical wave can be in any orientation in the plane of the chip and the indices seen by the wave, at the scale of the wave length, differ depending on the orientation of the electric field.

Presentation of the Invention

The purpose of the invention is to provide a photonic chip with means capable of collimating and widening an optical beam at the output from the photonic chip (and vice versa to focus and adapt an optical beam at the input to the photonic chip with vertical coupling structure of the photonic chip). And the invention aims to simplify the fabrication of such a chip, particularly to circumvent the fabrication disadvantages mentioned above (analogue profile, anti-reflection treatment).

Another purpose of the invention is to solve the problem of sensitivity of the angular alignment between the chip from which a widened collimated beam is extracted and the opto-mechanical interface part facing the face of the chip.

To achieve this, the invention discloses a photonic chip comprising a light guiding layer supported by a substrate and covered by an encapsulation layer, the photonic chip having a front face on the side of the encapsulation layer and a back face on the side of the substrate. The light guiding layer includes a light guiding structure optically coupled to a vertical coupler configured to receive light from the waveguide and to form a light beam directed towards either the front face or the back face.

The photonic chip also comprises a collimation structure formed at least partly in the light guiding layer, and an arrangement of one or several reflecting structures each on one of the front and back faces, said arrangement being made so as to propagate light between the vertical coupler and the collimation structure along an optical path with at least one fold.

The fold in the optical path extends the focal length of the collimation structure such that it can satisfactorily widen the diameter of the optical beam. Furthermore, the collimation structure at least partially integrated into the light guiding layer can have a digital profile that can be obtained by means of standard fabrication methods used for structuring components of the light guiding layer.

Some preferred but non-limitative aspects of this photonic chip are as follows:

the collimation structure comprises a plurality of trenches formed in the light guiding layer, the trenches delimiting a set of patterns and each pattern having an invariable thickness in a direction orthogonal to the front and back faces;

the patterns all have the same thickness;

the thickness of a pattern is at least equal to the thickness of the light guiding layer;

the patterns form a periodic two-dimensional grating in which the dimensions of the patterns are modulated from one period to another;

the light guiding layer is formed in a core material with refraction index nc, and the trenches are left containing air or are filled with an infill material with a refraction index nr less than the refraction index nc of the core material;

the collimation structure is configured to extract light passing through it from the vertical coupler along the normal to the front or back face of the chip;

the vertical coupler is a surface grating coupler or a faceted waveguide type coupler;

the substrate is made of silicon, the light guiding layer is supported on a layer made of a dielectric material and an anti-reflection layer is interposed between the substrate and the layer made of a dielectric material.

The invention also includes a method of fabricating such a photonic chip.

BRIEF DESCRIPTION OF THE DRAWINGS

Other aspects, purposes, advantages and characteristics of the invention will become clear after reading the following detailed description of preferred embodiments of the invention, given as non-limitative examples, with reference to the appended drawings among which:

FIGS. 9a and 9b supply examples of the sizing of a Fresnel type collimation structure, the structure in FIG. 9a not straightening up the light beam at the output from the chip and the structure in FIG. 9b straightening up the light beam at the output from the chip.

DETAILED PRESENTATION OF PARTICULAR EMBODIMENTS

Figure 1:
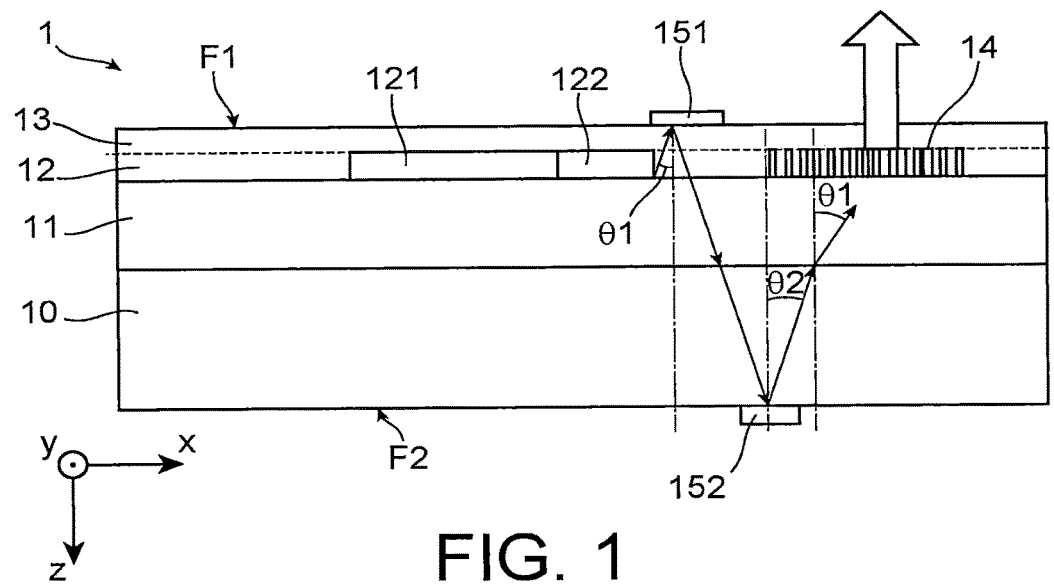
FIGS. 1 to 4 are diagrammatic layers of photonic chips in accordance with different alternative embodiments of the invention.

With reference to FIGS. 1-4, the invention relates to a photonic chip 1 that comprises a light guiding layer 12 supported by a substrate 10 and covered with an encapsulation layer 13. The thickness of the light guiding layer is generally between 100 nm and 3 µm thick. The light guiding layer can be made of silicon, InP, GaAs, Ge, or one or several type III-V or IV semiconductor materials.

A buried oxide layer 11 may be intercalated between the light guiding layer 12 and the substrate 10. The substrate may be made of silicon, indium phosphide or gallium arsenide. The encapsulation layer 13 may be a layer made of a dielectric material, for example silicon oxide, silicon nitride, or a polymer based on BCB (benzocyclobutene). The photonic chip 1 has a front face F1 on the side of the encapsulation layer 13 and a back face F2 on the side of the substrate 10. The light guiding layer comprises a light guiding structure 121 coupled to a vertical coupler 122 configured to receive light from the light guiding structure and to form from this structure a light beam directed towards either the front face or the back face.

Optical coupler means a coupler designed to change from guided propagation in the plane of the chip ((xy) plane on FIG. 1) to vertical or quasi-vertical propagation, typically forming an angle of less than 90°, and preferably between 0 and 45°, with the normal to the front and back faces of the chip (this normal extending along the z direction on FIG. 1), for example an angle θ1 of 8° in an encapsulation layer 13 made of $SiO_2$. The vertical coupler may be a surface grating coupler. The vertical coupler may also be a faceted waveguide type coupler.

The light guiding structure 121 comprises different photonic components, passive or active, as far as the vertical coupler 122. In particular, it comprises a waveguide, in this case represented in a longitudinal section through the vertical coupler 122, light propagating on FIG. 1 along the x direction.

The encapsulation layer 13 generally comprises metal electrical interconnection levels of the photonic chip. This layer is thus composed of dielectric materials and etched metal lines. An electronic chip designed to control or read active photonic components of the photonic chip (modulators, photo-detectors) is generally transferred onto the front face of the photonic chip.

Throughout the remainder of this document, calculation examples are given for a light guiding structure 121 made of silicon, a buried oxide layer 11 made of $SiO_2$, and a substrate 10 made of silicon.

A lens made of silica glass must be about 660 μm thick if a widened collimated beam with a diameter of 80 μm is to be obtained at the output from the chip, from a surface grating coupler 122 with mode size Do=9.2 μm. The result is that the lens cannot be integrated onto the front face F1 of the photonic chip because the optical path between the surface coupling grating 122 and the front face F1 of the chip is only a few microns of silica (its thickness is globally equal to the thickness of the encapsulation layer 13, for example 3 μm).

It is also not possible to integrate the lens onto the back face F2 of the chip using a vertical coupler 122 configured to direct the light beam received from the waveguide towards the back face. In this case, the length of the optical path between the vertical coupler 122 and the back face F2 of the chip can be assumed to be approximately equal to the thickness of the substrate 10. For Si, InP or GaAs substrates, the optical index at the 1.31 μm wave length is about 3.5, and the thickness of material necessary to obtained an 80 μm diameter widened collimated beam is of the order of 1550 μm. But the thickness of the substrate is typically equal to 775 μm+/−25 μm for a 300 mm diameter silicon substrate, 625 μm+/−25 μm for a 75 mm diameter InP substrate, and 450 μm for a 75 mm diameter GaAs substrate. Therefore the thickness of the substrate 10 is generally insufficient to be able to satisfactorily widen the beam diameter.

To overcome these difficulties in integrating the lens on the front face or back face of the photonic chip, and still with reference to FIGS. 1 to 4, the invention discloses a photonic chip provided with an arrangement of one or several reflecting structures 151, 152 each on either the front face or the back face. This arrangement is made so as to propagate light between the vertical coupler 122 and a light collimation structure 14 formed at least partly in the light guiding layer 12, this propagation taking place along an optical path with at least one fold in the substrate.

More particularly, this arrangement comprises a reflecting structure 152 on the back face. In this way, regardless of whether light is extracted through the front face (FIGS. 1, 2 and 3) or the back face (FIG. 4), the optical path comprises at least one double pass through the substrate 10. By thus extending the focal length, the collimation structure 14 makes it possible to satisfactorily widen the diameter of the optical beam.

In one embodiment, a reflecting structure of said arrangement is a metallic layer deposited on either the front face or the back face, for example, a gold, silver or aluminium layer. In one variant embodiment, a reflecting structure of said arrangement is a Distributed Bragg Reflector (DBR) composed of a stack of layers deposited on either the front face or the back face.

A reflecting structure is formed locally on either the front face or the back face of the photonic chip. Alternatively, a reflecting structure can be formed on the entire front face or back face of the photonic chip, for example on the entire back face as shown in the example embodiment in FIG. 2.

The description given below is particularly applicable to the example of light transmission from the photonic chip guiding structure towards the external device (extraction of light), the collimation structure forming an output port for light. However, the principles presented are identical for light transmission from the external device towards the photonic chip guiding structure (injection of light), the collimation structure forming an input port for light. Thus, the vertical coupler 122 is not only configured to receive light from the light guiding structure and form a light beam from the light guiding structure towards the front face F1 or the back face F2 and reflected by the reflecting structure(s) to reach and pass through the collimation structure 14, but also configured to receive a light beam from the front face or the back face after passing through the collimation structure and being reflected on the reflecting structure(s) and to transfer this beam towards the light guiding structure 121.

Figure 2:
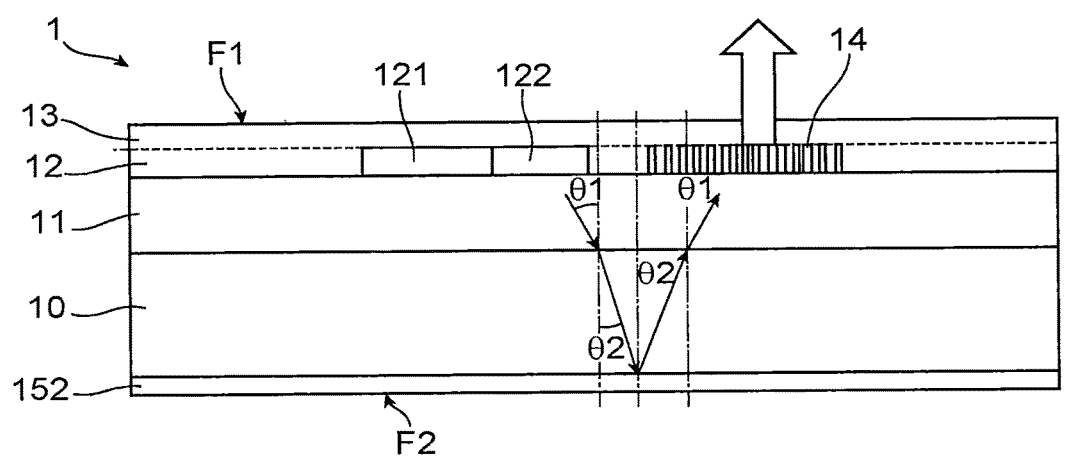
Figure 3:
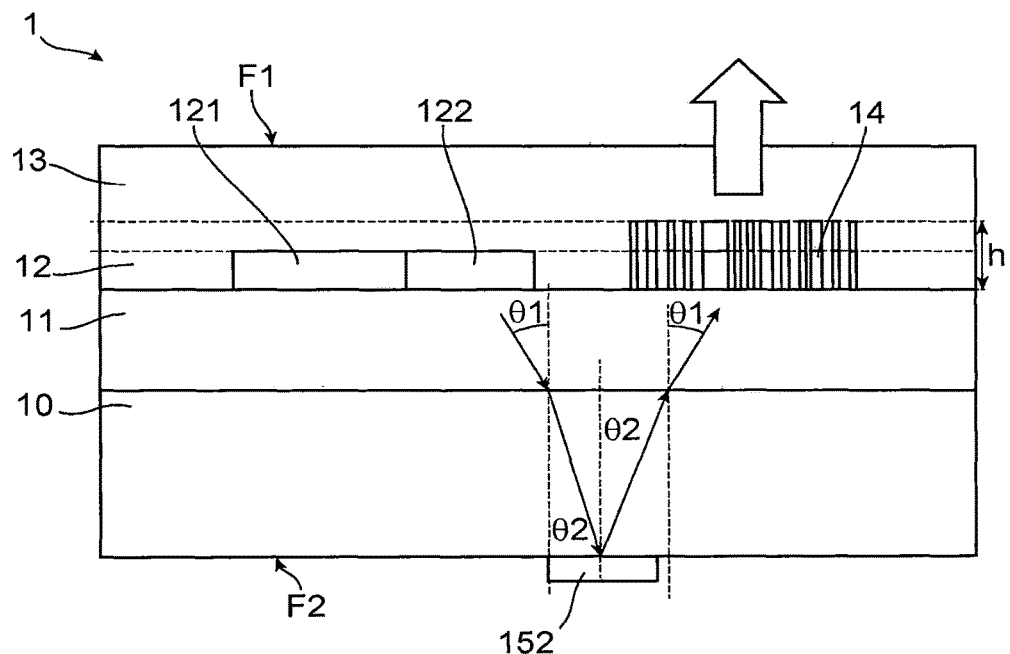

FIGS. 1, 2 and 3 show different examples of a first embodiment in which light is extracted from/injected into the photonic chip through the front face F1.

In the example in FIG. 1, the vertical coupler 122 is configured to received light from the light guiding structure 121 and to form from this light guiding structure a light beam directed towards the front face F1 at an angle Θ1 from the vertical. In this example, said arrangement of one or several reflecting structures comprises a first reflecting structure 151 on the front face F1 and a second reflecting structure 152 on the back face F2. The output beam from the vertical coupler 122 is reflected by the first reflecting structure 151 towards the second reflecting structure 152 and then from the second reflecting structure 152 towards the collimation structure 14. In this example, the optical path from the vertical coupler to the collimation structure can be approximated at 2×T10, in which T10 represents the thickness of the substrate 10.

In the examples in FIGS. 2 and 3, the vertical coupler 122 is configured to received light from the light guiding structure 121 and to form from this light guiding structure a light beam directed towards the back face F1 at an angle Θ1 from the vertical. In this example, the arrangement of one or several reflecting structures comprises a single reflecting structure 152 on the back face F2 (a full wafer structure in the context shown in FIG. 2, and a local structure in the context shown in FIG. 3). The output beam from the vertical coupler 122 is reflected by this single reflecting structure 152 towards the collimation structure 14. The angle Θ1 in the $SiO_2$ buried oxide layer 11 is for example about 8°. The angle Θ2 in the silicon substrate 10 is then about 3°. The optical path, CO from the vertical coupler to the collimation structure is rigorously written as CO=2×T11/cos (Θ1)+2×T10/cos (Θ2), in which T10 is the thickness of the substrate and T11 is the thickness of the buried oxide layer 11. This optical path can be approximated as 2×T10, with an error of less than 0.5%. Using a vertical coupler 122 of the surface grating coupler type and with a silicon substrate with a thickness T10=775 μm passed through twice, the diameter of the beam at the output from the collimation structure may be widened up to about 80 μm.

Figure 4:
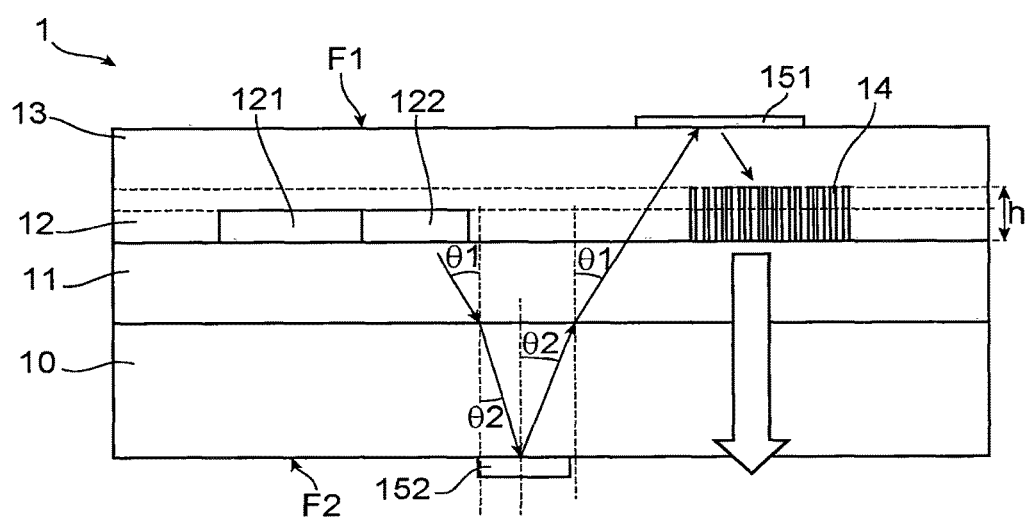

FIG. 4 shows an example of a second embodiment in which light is extracted from/injected into the photonic chip through the back face F2. In this example, the vertical coupler 122 is configured to receive light from the light guiding structure 121 and to form from this light guiding structure a light beam directed towards the back face F1 at an angle Θ1 from the vertical in the SiO2. The arrangement of one or several reflecting structures comprises a first reflecting structure 152 on the back face F2 and a second reflecting structure 151 on the front face F1. The output beam from the vertical coupler 122 is reflected by the first reflecting structure 152 towards the second reflecting structure 151 and then from the second reflecting structure 151 towards the collimation structure 14.

In one possible embodiment, the light guiding layer is supported on a layer made of a dielectric material and an anti-reflection layer is interposed between the substrate and the layer made of a dielectric material. Fresnel losses are effectively observed during the crossing of the interface between the dielectric layer 11 and the substrate 10: they are 0.8 dB with a layer 11 made of $SiO_2$ and a substrate 10 made of silicon. An antireflection layer formed between the dielectric layer 11 and the substrate 10 limits these losses. The anti-reflection layer is for example a silicon nitride layer with a thickness of λ/4 in which λ is the wavelength of the light beam. It is also possible to adopt a silicon nitride or a stack of an SiO2 sub-layer and a silicon nitride sub-layer, instead of $SiO_2$, for the material of layer 11. Losses during the crossing of the interface between the layer 11 and the substrate 10 are thus less than 0.5 dB at the wavelength of 1.31 μm In the context of the invention, the collimation structure 14 is formed at least partly in the light guiding layer 12. The invention thus does not use a transferred collimation structure or an integrated structure at the front face or the back face of the photonic chip, which circumvents the fabrication constraints and limitations mentioned above.

Figure 5A:
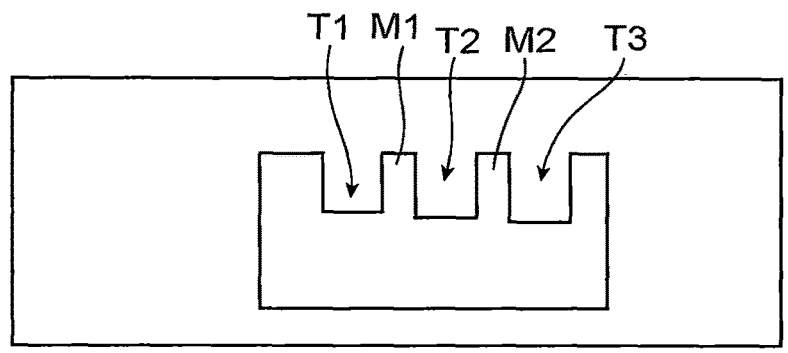
FIGS. 5a, 5b and 5c are diagrams of lenses made by etching according to the etching modes referred to as digital (FIG. 5a) and as analogue (FIGS. 5b and 5c) respectively in the presentation of the invention.

In particular, the collimation structure 14 can be formed during 'front end' fabrication steps of photonic components (waveguide, surface grating coupler, PN modulator, etc.) by etching the surface layer 12 of a SOI substrate. With reference particularly to FIG. 5A, the collimation structure 14 can thus comprise a plurality of trenches T1, T2, T3 formed in the light guiding layer 12, the trenches delimiting a set of patterns M1, M2 and each pattern having an invariable thickness in a direction orthogonal to the front and back faces. In one preferred embodiment, the patterns all have the same thickness and the trenches pass through the thickness of the light guiding layer 12. However, the invention includes patterns with different thicknesses and more particularly patterns distributed among a first set of patterns with a first thickness and a second set of patterns with a second thickness. The first thickness can be greater than the second thickness, and patterns of the first assembly can be wider than the patterns of the second assembly.

The thickness of the patterns is typically defined by a trench etching depth. The thickness of a pattern can be less than, equal to or even greater than the thickness of the waveguide 121 of the light guiding layer (equal to the thickness of the waveguide on FIGS. 1 and 2, greater than the thickness of the waveguide on FIGS. 3 and 4). On FIG. 4, the thickness h of the patterns corresponds to the thickness of the light guiding layer 12 (the waveguide being thinner than the light guiding layer 12) while in FIG. 3, the thickness h of the patterns is more than the thickness of the light guiding layer 12. In the alternative embodiment in FIG. 3, the patterns are composed of the material in the light guiding layer and of the material of an additional layer added to the light guiding layer. This additional layer is for example made of deposited amorphous silicon or crystalline silicon, or any other material with a high index in comparison with the index of air or the material used to infill the trenches.

Figure 5B:
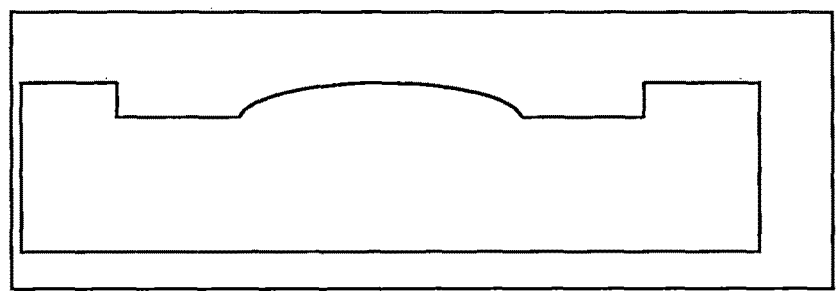
Figure 5C:
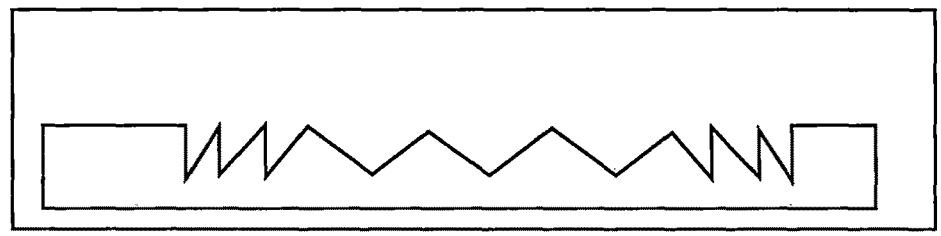

The collimation structure can thus be fabricated by means of standard fabrication steps (lithography/etching), in other words that give rise to "digital" structures (FIG. 5a, in which a digital 1 corresponds to etching a trench and a digital 0 corresponds to lack of etching to define a pattern with invariable thickness) unlike collimation structures according to the state of the art that require "analogue" structuring to define variable thickness patterns, for example a spherical diopter (FIG. 5b) or peaks with variable inclinations (FIG. 5c). Such an analogue structure is generally obtained making use of a resin creep lithography technology or "Grey tone" lithography that has the disadvantage that is difficult to calibrate to obtain the required analogue shapes.

It will also be noted that the formation of a digital lens in the light guiding layer with a high index only requires thin patterns within this thickness. Thus, when the patterns are made in a silicon layer with index 3.5 and the trenches are left in air, the thickness of the patterns is at least about 1 μm. With patterns made in an SiO2 encapsulation layer with index 1.5, the trenches being in air, this minimum thickness is about 7 μm. With 100 nm diameter cylindrical patterns, the length-diameter ratio of the patterns is equal to 10 when they are made in the light guiding layer and the length-diameter ratio is equal to 70 when they are made in the encapsulation layer. In practice, at the present time it is impossible to obtain a ratio of 70 by etching. Patterns that are this small (100 nm diameter) are also difficult to etch in an encapsulation layer using microelectrics fabrication tools, because the layer is not sufficiently plane.

Such a digital lens is also advantageous in that it can be made in the light guiding layer at the same time as a surface grating coupler ype of vertical coupler, by photolithography and etching. Any alignment error between these components is then eliminated, unlike the case in which the lens is formed on the chip surface, after fabrication and structuring of the light guiding layer in particular to form a vertical coupler that is affected by alignment errors that degrade performances.

The invention benefits from a large focal length due to folding of the optical path between the vertical coupler and the collimation structure (this focal length is at least twice the thickness of the substrate 10). It also makes it possible to make the collimation structure before formation of metal layers of the photonic chip, this structure being made at the light guiding layer, in other words at the components of the photonic chip.

Figure 6A:
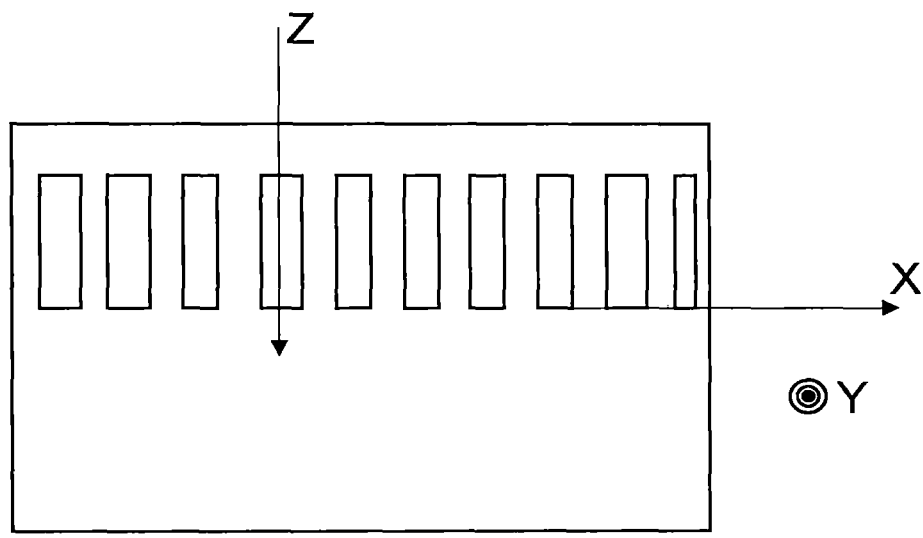
FIGS. 6a and 6b illustrate different variant embodiments of a collimation structure that can be integrated into a chip according to the invention.
Figure 6B:
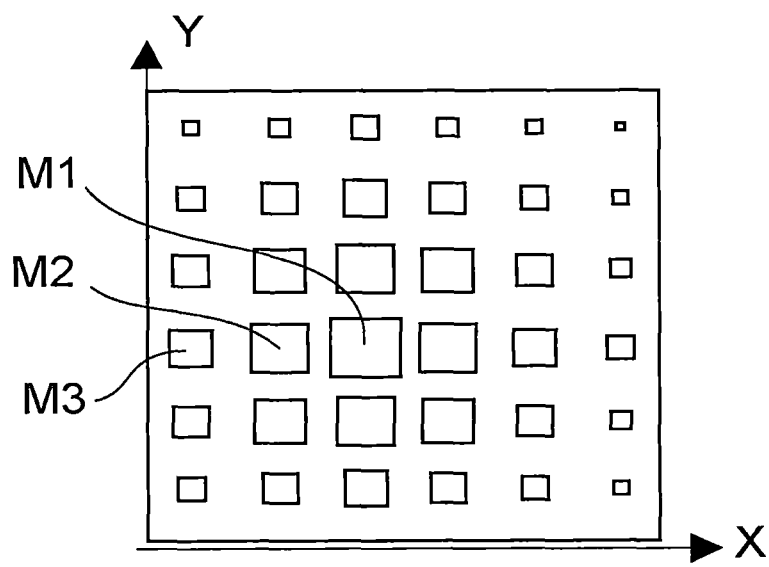

Using the (xyz) coordinate system in FIG. 1 and with reference to FIG. 6a, each trench has a depth along the direction orthogonal to the front and back faces (z direction). The trenches separate patterns with invariable thickness that can form a two-dimensional grating. As shown in FIGS. 6b, 7b and 8b, the patterns can form a matrix grating of pads with a square or rectangular (FIG. 6c) or circular (FIGS. 7b and 8b) section in the (xy) plane). In particular, the patterns can be arranged in circular symmetry about an axis of symmetry not necessarily coincident with the median axis of the collimation structure passing through its centre, patterns equidistant from the axis of symmetry having an identical size. These shapes, unlike the rings, enable insensitivity to polarisation. The electric field of the optical wave can have any orientation in the (xy) plane and the indices seen by the wave, at the scale of the wave length, are identical regardless of the orientation of the electric field.

Structuring of the core layer 1 consists of forming a plurality of trenches T1-T4 with a refraction index lower than the refraction index of the patterns. As a consequence, the collimation structure forms a structure with a pseudo-gradient of the refraction index so as to collimate a curved incident wave front from the vertical coupler to the exterior (and vice versa to generate a curved phase shift from a plane incident wave front from the exterior). More particularly, the light guiding layer is formed in a core material with refraction index nc in which the patterns are formed, and the trenches are left containing air or are filled with an infill material with a refraction index nr less than the refraction index nc of the core material, for example made of $SiO_2$. The difference between the refraction indices of the core and the trenches is preferably equal to at least 0.2.

Pseudo-index gradient, in the context of the invention means that the collimation structure does not form a genuine profile for variation of the refraction index of the core material as is the case with "graded-index" structures, but it does have the same properties. Thus, during its passage in the collimation structure, light encounters the equivalent of a lens.

The trenches may be arranged periodically, the width of the trenches separating two contiguous patterns being modulated from one trench to another. In this way, the infill factor made of the material of the core layer (that defines the local refraction index) varies along the collimation structure.

Considering the example of a matrix layout of cylindrical pads, this layout comprises a set of square elementary cells of the same size, there is one pad per cell and the area of the pads varies from one cell to the next. The infill factor can then be expressed as the ratio between the area of a pad and the area of the elementary cell. With a square elementary cell with a side dimension of 500 nm, the diameter of the pads can vary between 20 nm and 480 nm.

It will be noted that the proposed structure has smaller reflections than an analogue lens (classical or Fresnel). The average index is very much reduced.

Figure 8B:
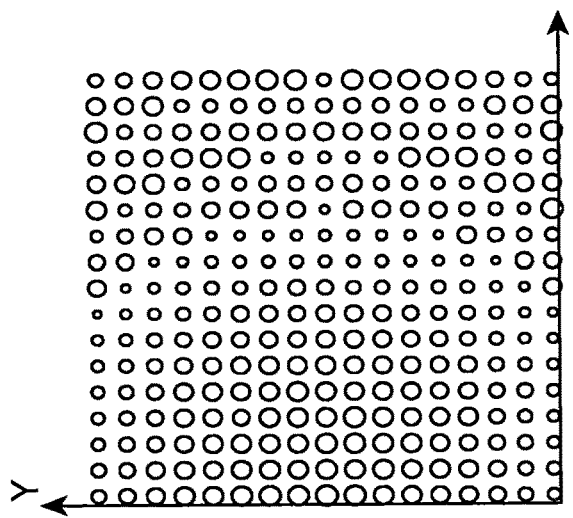
FIGS. 8a and 8b illustrate the sizing of a asymmetric collimation structure that can be integrated into a chip according to the invention.
Figure 8A:
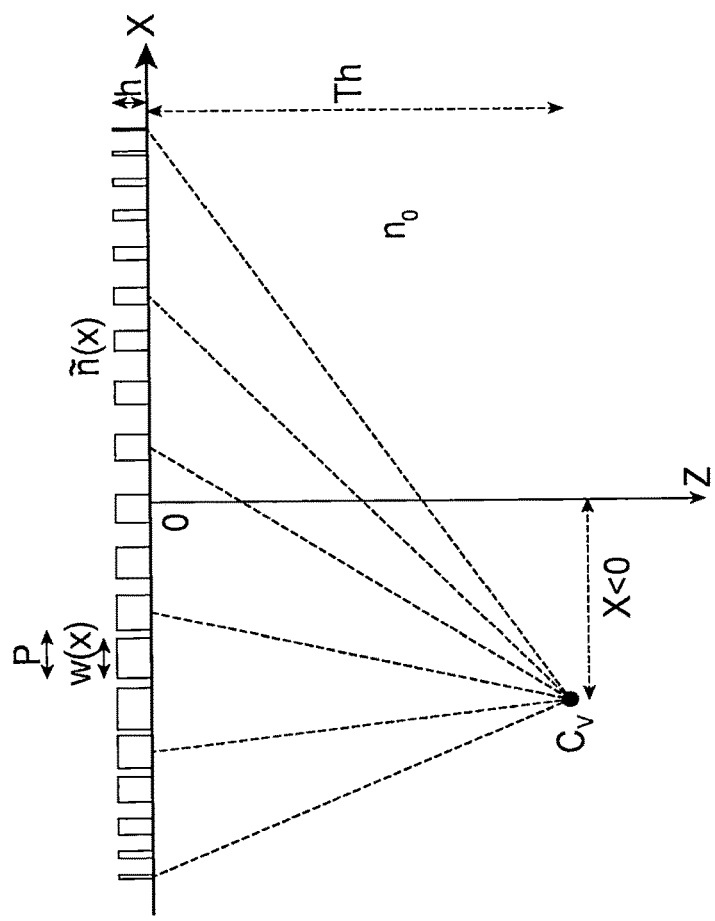

In one possible embodiment of the invention, the collimation structure is configured to extract light passing through it from the vertical coupler along the normal to the front or back face of the chip. It has already been seen that in some configurations, the vertical coupler can change from guided propagation in the plane of the chip to quasi-vertical propagation forming an angle from the normal to the front and back faces of the chip. In the context of this embodiment, the collimation structure straightens the beam such that the output beam from the front or back face of the photonic chip is perpendicular to the front and back faces of the chip (FIGS. 8a and 8b discussed below).

The fact of using a widened collimated beam according to the invention can increase the alignment tolerance along the x, y axes of the chip with an opto-mechanical interface part placed on one face of the chip. But the angular reception tolerance is reduced. Straightening up the beam so that it makes an angle of 90° with the face of the chip facilitates coupling with the interface part. Thus, the part can be placed on the plane surface of the chip, so that it is strictly perpendicular to the chip. The problem of angular alignment sensitivity is thus completely solved because the opto-mechanical part in contact with face F1 of the chip is precisely perpendicular to the chip, without any possible angular deviation from the z axis.

Figure 7A:
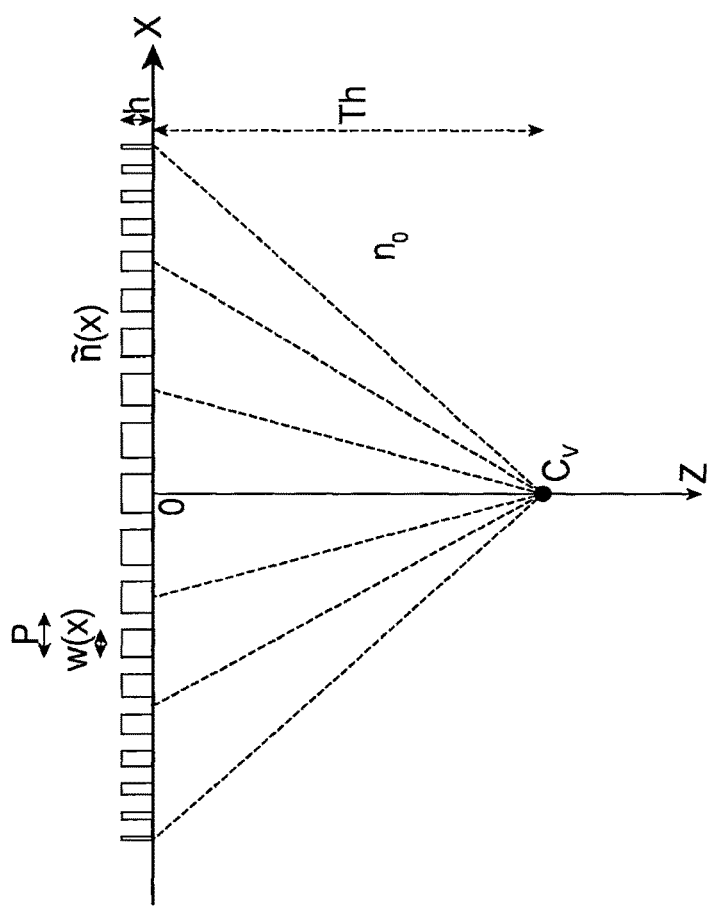
FIGS. 7a and 7b illustrate the sizing of a symmetric collimation structure that can be integrated into a chip according to the invention.
Figure 7B:
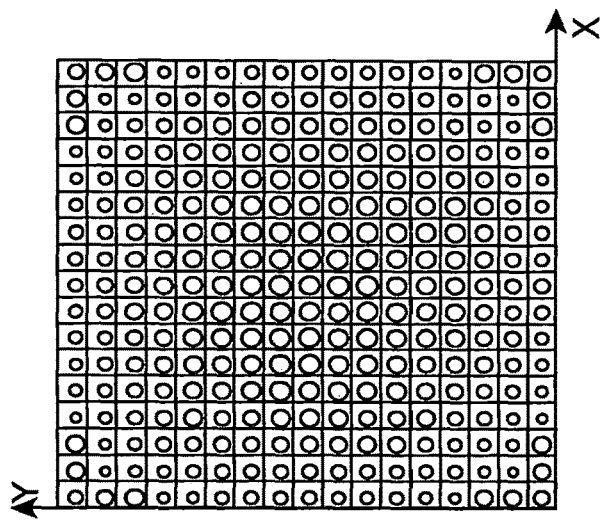

FIGS. 7a-7b illustrate the sizing of a symmetric collimation structure located vertically in line with the vertical coupler 122 represented by point Cv on the z axis (case in which Θ1=Θ2=0). FIGS. 8a-8b illustrate the sizing of an asymmetric collimation structure offset by X=Th×tan Θ2 from the vertical coupler 122 and can straighten up the collimated beam extracted from the coupler 122. Although not shown here, it is obviously possible to extract a non-vertical collimated beam (Θ2≠0) without straightening it up: a symmetric collimation structure is then used, its centre being offset by X=Th×tan Θ2 from the vertical coupler 122. These collimation structures can be integrated into a chip according to the invention, conforming with a two-dimensional lattice of cylindrical pads insensitive to polarisation.

In the context of the invention, with folding of the optical path illustrated on FIGS. 1 to 4 that impose two passages of light through the substrate, the offset is then 2×Th×tan Θ2 and the following equations must be adapted accordingly. The lens has a median axis perpendicular to the x, y plane and passing through its centre. The orthogonal projection on the x, y plane, of the centre of the vertical coupler is then offset by a distance approximately equal to 2×Th×tan Θ2 from the centre of the lens. If there is no straightening, the collimation structure can have a circular symmetry about an axis of symmetry coincident with its median axis. In the presence of straightening, the collimation structure can have circular symmetry about an axis of symmetry at a distance of 2×Th×tan Θ2 from its median axis (the axis of symmetry thus passes through the centre of the vertical coupler). Obviously, any variation in the intermediate angle between the absence and the presence of straightening can be made by offsetting the centre of circular symmetry of the lens.

The collimation structure is configured to generate a curved phase shift of a plane incident wave front from the exterior of the chip, phase shift such that the rays, after passing through the collimation structure, all in phase at the focal point of the collimation structure, the focal point being the vertical coupler (considered to be a point facing the focal distance Th that globally corresponds to twice the thickness of the substrate 10). Conversely, the collimation structure generates a plane wave front from a divergent beam output from the vertical coupler. FIGS. 7a and 8a are views of the patterns in a section parallel to the (xz) plane while FIGS. 7b and 8b are views of the patterns in a section parallel to the (xy) plane.

The diameter of the pads is calculated according to the methodology presented below.

In the example in FIGS. 7a and 7b in which the focal point is on the median axis z of the collimation structure, and the trench infill is SiO$_2$, this configuration results in:

$$\frac{2\pi}{\lambda}\tilde{n}(x,y)h + \frac{2\pi}{\lambda}n_0\sqrt{F^2+x^2+y^2} = \frac{2\pi}{\lambda}\tilde{n}(0)h + \frac{2\pi}{\lambda}n_0 F$$

Namely $$\tilde{n}(x,y) = \tilde{n}(0) - \frac{n_0\sqrt{F^2+x^2+y^2} - n_0 F}{h},$$

in which ñ(x, y) represents the average index of the lens at position (x, y), related to the silicon filling factor, h the thickness of the silicon patterns, Th corresponds to twice the thickness of the substrate (for example 2×775 µm for a 300 mm diameter SOI substrate), λ the central wave length of the light beam and $n_0$ the index of the material forming the substrate 10.

The average index ñ(x) is related to the silicon filling factor $f_{Si}(x)$, by:

$$\tilde{n}(x) = \sqrt{f_{Si}(x)*n_{Si}^2 + (1-f_{Si}(x))*n_{SiO_2}^2},$$

in which $n_{Si}$ and $n_{SiO_2}$ are the indexes of silicon and SiO2 respectively.

The variation of the silicon filling factor is deduced:

$$f_{Si}(x) = \frac{\left(\sqrt{f_{Si}(0)*n_{Si}^2 + (1-f_{Si}(0))*n_{SiO_2}^2} - \frac{n_0\sqrt{F^2+x^2+y^2} - n_0 F}{h}\right)^2 - n_{SiO_2}^2}{\left(n_{Si}^2 - n_{SiO_2}^2\right)}$$

If it is considered that the collimation structure is like a pseudoperiodic grating, with a pseudoperiod P (position of pad centres) and for which the variable diameter of the pads $W_{Si}(x, y)$, the patterns have a diameter defined according to a series $W_{Si}(n, p)$, satisfying, for n∈[−N; N] and p∈[−N; N]:

$$W_{Si}(n,p) = 2P \cdot \sqrt{\frac{\left(\sqrt{\frac{\pi W_{Si}(0)^2 * n_{Si}^2 + (4P^2 - \pi W_{Si}(0)^2)*n_{SiO_2}^2}{4P^2}} - \frac{n_0\sqrt{F^2+(nP)^2+(pP)^2} - F}{h}\right)^2 - n_{SiO_2}^2}{\pi\left(n_{Si}^2 - n_{SiO_2}^2\right)}} \quad (1)$$

In the example in FIGS. 8a and 8b, the focal point of the collimation structure is offset from the median axis z by a distance X=Th×tan Θ2. The collimation structure is calculated as follows:

$$\frac{2\pi}{\lambda}\tilde{n}(x,y)h + \frac{2\pi}{\lambda}n_0\sqrt{F^2+(x-X)^2+y^2} = \frac{2\pi}{\lambda}\tilde{n}(0)h + \frac{2\pi}{\lambda}n_0\sqrt{F^2+X^2}$$

Namely, $$\tilde{n}(x) = \tilde{n}(0) - n_0\frac{\sqrt{F^2+(x-X)^2+y^2} - \sqrt{F^2+X^2}}{h}.$$

Knowing that:

$$\tilde{n}(x) = \sqrt{f_{Si}(x)*n_{Si}^2 + (1-f_{Si}(x))*n_{SiO_2}^2}$$

We can deduce:

$$f_{Si}(x) = \frac{\left(\sqrt{f_{Si}(0)*n_{Si}^2 + (1-f_{Si}(0))*n_{SiO_2}^2} - n_0\frac{\sqrt{F^2+(x-X)^2+y^2} - \sqrt{F^2+X^2}}{h}\right)^2 - n_{SiO_2}^2}{\left(n_{Si}^2 - n_{SiO_2}^2\right)}$$

If it is considered that the collimation structure is like a pseudoperiodic grating, with a pseudoperiod P (position of pad centres) and for which the variable diameter of the pads $W_{Si}(x, y)$, the patterns have a diameter defined according to a series $W_{Si}(n, p)$, satisfying, for n∈[−N; N] and p∈[−N; N]:

$$W_{Si}(n,p) = 2P \cdot \sqrt{\frac{\left(\sqrt{\frac{\pi W_{Si}(0)^2 * n_{Si}^2 + (4P^2 - \pi W_{Si}(0)^2)*n_{SiO_2}^2}{4P^2}} - n_0\frac{\sqrt{F^2+(nP-X)^2+(pP)^2} - \sqrt{F^2+X^2}}{h}\right)^2 - n_{SiO_2}^2}{\left(n_{Si}^2 - n_{SiO_2}^2\right)}} \quad (2)$$

For a collimation structure without straightening, the central pattern is the widest and therefore $W_{Si}(0)=P-cd\_min$ can be fixed, with cd_min the minimum width of a trench that is technically feasible by etching. Such a collimation structure is symmetric.

For a collimation structure that straightens up the beam (case in FIG. 8b), the position of the largest pattern can be found by differentiating equation (2) with respect to n: the pattern with abscissa X is largest (the pattern vertically in line with the focal point). Therefore this collimation structure is asymmetric.

For this asymmetric collimation structure, the equations can be written no longer as a function of $W_{Si}(0)$, but as a function of $W_{Si}(X)$:

$$\frac{2\pi}{\lambda}\tilde{n}(x,y)h + \frac{2\pi}{\lambda}n_0\sqrt{F^2+(x-X)^2+y^2} = \frac{2\pi}{\gamma}\tilde{n}(X,0)h + \frac{2\pi}{\lambda}n_0 F$$

Namely:

$$\tilde{n}(x,y) = \tilde{n}(X,0) + \frac{n_0}{h}\left[F - \sqrt{F^2(x-X)^2+y^2}\right]$$

$$f_{Si}(x) = \frac{\left[\sqrt{\dfrac{f_{Si}(X)*n_{Si}^2 + (1-f_{Si}(X))*n_{SiO_2}^2}{}} + \dfrac{n_0}{h}\left[F-\sqrt{F^2+(x-X)^2+y^2}\right]\right]^2 - n_{SiO_2}^2}{\left(n_{Si}^2 - n_{SiO_2}^2\right)}$$

Namely:

$$W_{Si}(n,p) = 2P\cdot\sqrt{\frac{\left[\sqrt{\dfrac{\pi W_{Si}(0)^2 * n_{Si}^2 + (4P^2 - \pi W_{Si}(0)^2)*n_{SiO_2}^2}{4P^2}} - n_0\dfrac{\left[\sqrt{F^2+(nP-X)^2+(pP)^2}-F\right]}{h}\right]^2 - n_{SiO_2}^2}{\pi\left(n_{Si}^2 - n_{SiO_2}^2\right)}}$$

When X<D/2 in which D is the width of the collimation structure along the x axis, the largest pattern is the pattern on the abscissa X: $W_{Si-max} = W_{Si}(X) = P-cd\_min$.

We can deduce:

$$W_{Si}(n,p) = 2P\cdot\sqrt{\frac{\left[\sqrt{\dfrac{\pi(P-cd\_min)^2 * n_{Si}^2 + (4P^2 - \pi(P-cd\_min)^2)*n_{SiO_2}^2}{4P^2}} - n_0\dfrac{\left[\sqrt{F^2+(nP-X)^2+(pP)^2}-F\right]}{h}\right]^2 - n_{SiO_2}^2}{\pi\left(n_{Si}^2 - n_{SiO_2}^2\right)}} \quad (3)$$

The minimal diameter of a pattern can also be determined $W_{Si-min}$, which is the diameter of the pattern furthest from the abscissa X. We have:

$$W_{Si-min} = 2P\cdot\sqrt{\frac{\left[\sqrt{\dfrac{\pi(P-cd\_min)^2 * n_{Si}^2 + (4P^2 - \pi(P-cd\_min)^2)*n_{SiO_2}^2}{4P^2}} - n_0\dfrac{\left[\sqrt{F^2+(NP+X)^2+(NP)^2}-F\right]}{h}\right]^2 - n_{SiO_2}^2}{\pi\left(n_{Si}^2 - n_{SiO_2}^2\right)}} = cd\_min$$

This latter equation is used to determine the minimum etching thickness h to design a technically feasible collimation structure, in other words not exceeding cd_min and P-cd_min in pattern diameter, for a given lens width D along the x axis:

$$h = n_0 \frac{2P\left[\sqrt{F^2+(NP+X)^2+(NP)^2} - F\right]}{\sqrt{\pi(P-cd\_min)^2 * n_{Si}^2 + (4P^2 - \pi(P-cd\_min)^2)*n_{SiO_2}^2} - \sqrt{\pi cd_{min}^2 * (n_{Si}^2 - n_{SiO_2}^2) + 4P^2 n_{SiO_2}^2}} \quad (4)$$

On the other hand, if X>D/2, then the largest pattern is the pattern closest to the abscissa X. Considering the case X>0 in which the largest pattern is the pattern of index N (for X<0, the collimation structure simply needs to be turned over). The equations are rewritten for this pattern with index N:

$$\frac{2\pi}{\lambda}\tilde{n}(x,y)h + \frac{2\pi}{\lambda}n_0\sqrt{F^2+(x-X)^2+y^2} =$$
$$\frac{2\pi}{\lambda}\tilde{n}(NP)h + \frac{2\pi}{\lambda}n_0\sqrt{F^2+(NP-X)^2}$$

The final result is:

$$\tilde{n}(x, y) = \tilde{n}(NP) - n_0 \frac{\sqrt{F^2 + (x - X)^2 + y^2} - \sqrt{F^2 + (NP - X)^2}}{h}$$

$$W_{Si}(n, p) =$$

$$2P \sqrt{\frac{\left[\sqrt{\frac{\pi W_{Si}(NP)^2 * n_{Si}^2 + (4P^2 - \pi W_{Si}(NP)^2) * n_{SiO_2}^2}{4P^2}} - \left[n_0 \frac{\left[\sqrt{F^2 + (nP - X)^2 + (pP)^2} - \sqrt{F^2 + (NP - X)^2}\right]}{h}\right]^2 - n_{SiO_2}^2\right]}{\pi(n_{Si}^2 - n_{SiO_2}^2)}}$$

By imposing the largest dimension on the pattern with index N, we obtain:

$$W_{Si}(n, p) = 2P \cdot \quad (3\text{bis})$$

$$\sqrt{\frac{\left[\sqrt{\frac{\pi(P - \text{cd\_min})^2 * n_{Si}^2 + (4P^2 - \pi(P - \text{cd\_min})^2) * n_{SiO_2}^2}{4P^2}} - \left[n_0 \frac{\left[\sqrt{F^2 + (nP - X)^2 + (pP)^2} - \sqrt{F^2 + (NP - X)^2}\right]}{h}\right]^2 - n_{SiO_2}^2\right]}{\pi(n_{Si}^2 - n_{SiO_2}^2)}}$$

The pad with the smallest dimension is then the pad with index $(-N, \pm N)$:

$$W_{Si-min} =$$

$$2P \cdot \sqrt{\frac{\left[\sqrt{\frac{\pi(P - \text{cd\_min})^2 * n_{Si}^2 + (4P^2 - \pi(P - \text{cd\_min})^2) * n_{SiO_2}^2}{4P^2}} - \left[n_0 \frac{\left[\sqrt{F^2 + (NP + X)^2 + (NP)^2} - \sqrt{F^2 + (NP - X)^2}\right]}{h}\right]^2 - n_{SiO_2}^2\right]}{\pi(n_{Si}^2 - n_{SiO_2}^2)}} = \text{cd\_min}$$

The result for the value of h in this case is:

$$h = n_0 \frac{2P\left[\sqrt{F^2 + (NP + X)^2 + (NP)^2} - \sqrt{F^2 + (NP - X)^2}\right]}{\sqrt{\pi(P - \text{cd\_min})^2 * n_{Si}^2 + (4P^2 - \pi(P - \text{cd\_min})^2) * n_{SiO_2}^2} - \sqrt{\pi \text{cd}_{min}^2 * (n_{Si}^2 - n_{SiO_2}^2) + 4P^2 n_{SiO_2}^2}} \quad (4\text{bis})$$

The design procedure for the collimation structure can be as follows:

1) Considering P and cd_min, the thickness necessary for the collimation structure according to equations (4) or (4bis) is determined, depending on whether X<D/2 or X>D/2.

2) The next step is to use the thickness h found above to deduce the exact profile of the collimation structure according to equations (3) or (3bis), depending on whether X<D/2 or X>D/2.

In one variant embodiment, the collimation structure does not form the equivalent of a single lens but the equivalent of a Fresnel lens. According to this approach, a smaller thickness h is imposed and larger index gradients are allowed to compensate for this small thickness, these gradients repeating by phase modulos $2\pi$ to cover the entire width of the collimation structure. According to this approach:

$$\frac{2\pi}{\lambda}\tilde{n}(x, y)h + \frac{2\pi}{\lambda}n_0\sqrt{F^2 + (x - X)^2 + y^2} = \frac{2\pi}{\lambda}\tilde{n}(X)h + \frac{2\pi}{\lambda}n_0 F[2\pi]$$

Namely $$\tilde{n}(x, y) = \tilde{n}(X) - \frac{n_0}{h}\left[\sqrt{F^2 + (x - X)^2 + y^2} - F\right] + m\frac{\lambda}{h}, m \in Z^+$$

Namely $$f_{Si}(x, y) = \frac{\left[\sqrt{f_{Si}(X) * n_{Si}^2 + (1 - f_{Si}(X)) * n_{SiO_2}^2} - \frac{n_0}{h}\left[\sqrt{F^2 + (x - X)^2 + y^2} - F\right] + m\frac{\lambda}{h}\right]^2 - n_{SiO_2}^2}{(n_{Si}^2 - n_{SiO_2}^2)}$$

Namely:

$$W_{Si}(n, p) = \quad (5)$$

$$2P \cdot \sqrt{\frac{\left[\sqrt{\frac{\pi(P - \text{cd\_min})^2 * n_{Si}^2 + (4P^2 - \pi(P - \text{cd\_min})^2) * n_{SiO_2}^2}{4P^2}} - \left[n_0 \frac{\left[\sqrt{F^2 + (nP - X)^2 + (pP)^2} - F\right]}{h} + m\frac{\lambda}{h}\right]^2 - n_{SiO_2}^2\right]}{\pi(n_{SiO_2}^2 - n_{SiO_2}^2)}}$$

The term m adds an increment to the width so that it will not go below cd_min. However, this increment must not modify the width beyond than P−cd_min to obtain the phase modulo $2\pi$ or below cd_min respectively. This imposes constraints on the minimum thickness of the Fresnel lens hmin, so that it is technically feasible. Assume that the width of one of the patterns is cd_min (lower limit). This pattern has an index (n', p') that satisfies:

$$\frac{\text{cd\_min}^2 \pi (n_{Si}^2 - n_{SiO_2}^2) + 4P^2 \cdot n_{SiO_2}^2}{4P^2} =$$

$$\frac{n_{Si}^2 + (4P^2 - \pi(P - \text{cd\_min})^2) * n_{SiO_2}^2}{4P^2} - n_0 \frac{\left[\sqrt{F^2 + (nP - X)^2 + (pP)^2} - F\right]^2}{h}$$

An addition of λ/h into the square of the term at the right generates a width of less than P−cd_min in equation (5), namely:

$$P - cd_{\min} \geq 2P \cdot \sqrt{\frac{\mathrm{cd\_min}^2 \pi(n_{Si}^2 - n_{SiO_2}^2) + 4P^2 \cdot n_{SiO_2}^2}{4P^2} + \frac{\lambda^2}{h_{\min}^2} + 2\frac{\lambda}{h_{\min}}\sqrt{\frac{\mathrm{cd\_min}^2 \pi(n_{Si}^2 - n_{SiO_2}^2) + 4P^2 \cdot n_{SiO_2}^2}{4P^2}}}{\pi(n_{Si}^2 - n_{SiO_2}^2)}}$$

Therefore it is deduced that there is a constraint between the wavelength and the thickness, for a given technology (P, cdmin), otherwise the Fresnel lens cannot be used.

$$\left[ P\pi(P - 2cd_{\min})(n_{Si}^2 - n_{SiO_2}^2) - 4P^2 n_{SiO_2}^2 \right] \cdot h^2 - \left[ 8P^2\lambda\sqrt{\frac{\mathrm{cd\_min}^2\pi(n_{Si}^2 - n_{SiO_2}^2) + 4P^2 \cdot n_{SiO_2}^2}{4P^2}} \right] h - 4P^2\lambda^2 \geq 0$$

Therefore hmin corresponds to the $2^{nd}$ root of the relevant $2^{nd}$ degree equation, namely:

$$h_{\min} = 2\lambda \frac{\sqrt{\mathrm{cd\_min}^2 \pi(n_{Si}^2 - n_{SiO_2}^2) + 4P^2 \cdot n_{SiO_2}^2} + \sqrt{\pi(n_{Si}^2 - n_{SiO_2}^2)}(P - cd_{\min})}{\pi(P - 2cd_{\min})(n_{Si}^2 - n_{SiO_2}^2) - 4Pn_{SiO_2}^2} \quad (6)$$

The period P cannot exceed λ/2 for the structure to behave like a medium with average index. In imposing this constraint, expression (6) can be simplified to give:

$$h_{\min} = 2\lambda \frac{2\sqrt{\mathrm{cd\_min}^2 \pi(n_{Si}^2 - n_{SiO_2}^2) + \lambda^2 \cdot n_{SiO_2}^2} + \sqrt{\pi(n_{Si}^2 - n_{SiO_2}^2)}(\lambda - 2cd_{\min})}{\pi(\lambda - 4cd_{\min})(n_{Si}^2 - n_{SiO_2}^2) - 4\lambda n_{SiO_2}^2}$$

The following is an example of the sizing of a collimation structure. A surface grating coupler is used as a vertical coupler (Do=9.2 μm), made using the silicon photonic technology, in an SOI substrate. A mode size wi=Di/2 (Di=D) at the output from the collimation structure is also fixed, for example Di=80 μm. The objective is to find the smallest possible thickness of cylindrical patterns in a two-dimensional lattice with constant mesh size P. The minimum diameter of a pattern is fixed at 80 nm, and a pseudo-period of etched structures P=500 nm is considered. A 775 μm thick SOI substrate is used, therefore Th=1550 μm. With an output angle from the surface coupling grating Θ1 in SiO2 equal to 8°, Θ2 in the silicon is equal to 3.3° ($n_{Si}$×sin (Θ2)=$n_{SiO2}$×sin (Θ1) in which $n_{Si}$=3.5 and $n_{SiO2}$=1.45). The result is a focal length in the substrate equal to about 750 μm. The centre of the collimation structure is shifted from the centre of the vertical coupler by X=2×Th×tan (Θ2) ~90 μm that must be more than Di/2, which is the case The above equations are used to calculate the minimum thickness of patterns of the collimation structure in the case in which it is of the single lens type or the Fresnel lens type. In the adopted digital application, the minimum thickness is 1.1 μm for the case of the Fresnel lens and several μm for the case of the single lens. The diameters of patterns to be etched to form the collimation structure are then calculated assuming $W_{Si\text{-}min}$=0.08 μm.

Figure 9B:
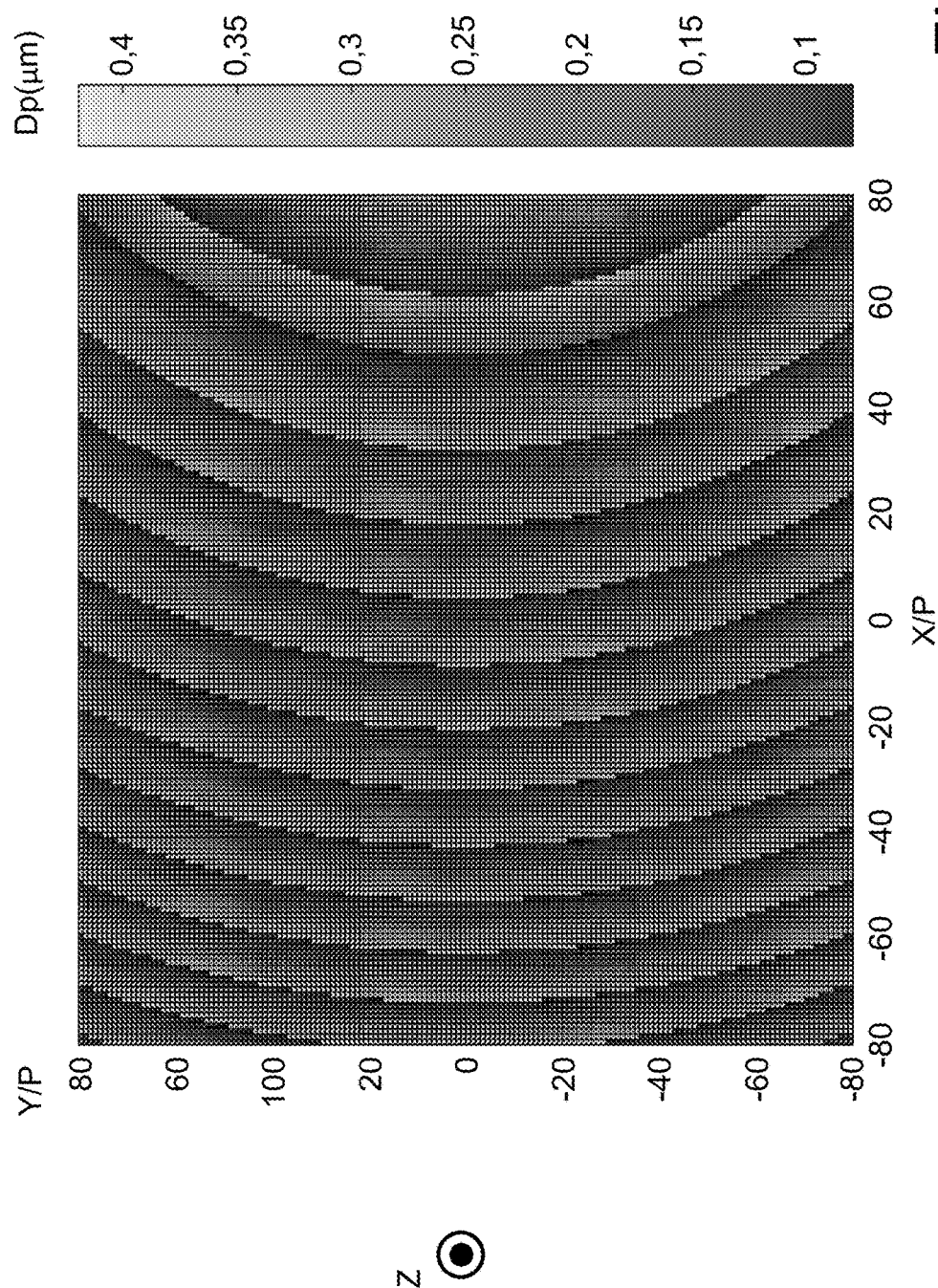

FIG. 9a represents an example sizing of a two-dimensional collimation structure that does not straighten up the light beam at the output from the chip, and FIG. 9b shows an example sizing of a collimation structure that does straighten up the light beam at the output from the chip. These figures more particularly represent the diameter Dp of cylindrical pads in the numerical application mentioned above. The thickness of the patterns is 1.1 μm.

These FIGS. 9a and 9b relate to structures of the Fresnel lens type. The diameter of the pads defines the average local index and therefore these figures also illustrate the pseudo-index gradient of the collimation structure. The variation profile of the diameter of pads in the collimation structure according to the invention can also be compared with the geometric profile for analogue lenses.

The invention is not limited to the photonic chip described above, it also includes its fabrication method, and particularly a method of fabricating several chips collectively on the same wafer. This method includes the formation of a collimation structure 14 at least partly in the light guiding layer 12, and the formation of an arrangement of one or several reflecting structures 151, 152 each on one of the front and back faces, said arrangement being made so as to propagate light between the vertical coupler and the collimation structure along an optical path with at least one fold.

The following gives an example embodiment of this method. The method begins with the supply of an SOI substrate with a buried oxide layer 11 intercalated between a surface silicon layer 121 and a silicon substrate 10. The method continues with the fabrication of photonic components (waveguide 121, vertical coupler 122, PN modulator, etc.) and patterns in the collimation structure 14 by partial or total local etching of the surface silicon layer 12

The next step is fabrication of the encapsulation layer 13. This layer may comprise metal electrical interconnection levels of the photonic chip. It may or may not fill in the trenches of the collimation structure. The next step is formation of the reflecting structure 152 on the back face, for example by deposition of a metallic layer. However, this operation may be done at any other time, for example at the beginning of the process.

The invention claimed is:

1. A photonic chip comprising a light guiding layer supported by a substrate and covered with an encapsulation layer, the photonic chip having a front face on the side of the encapsulation layer and a back face on the side of the substrate, the light guiding layer including a light guiding structure optically coupled to a vertical coupler configured to receive light from the waveguide and to form a light beam directed towards either the front face or the back face,
wherein the photonic chip further comprises a collimation structure formed at least partly in the light guiding layer and an arrangement of one or several reflecting structures each on either the front face or the back face, said arrangement being made so as to propagate light between the vertical coupler and the collimation structure along an optical path with at least one fold.

2. The photonic chip according to claim 1, wherein the vertical coupler is a surface grating coupler.

3. The photonic chip according to claim 1, wherein the collimation structure comprises a plurality of trenches formed in the light guiding layer, the trenches delimiting a set of patterns and each pattern having an invariable thickness in a direction orthogonal to the front and back faces.

4. The photonic chip according to claim 3, wherein all the patterns have the same thickness.

5. The photonic chip according to claim 3, wherein the thickness of a pattern is at least equal to the thickness of the light guiding layer.

6. The photonic chip according to claim 3, wherein the patterns form a periodic two-dimensional grating in which the dimensions of the patterns are modulated from one period to another.

7. The photonic chip according to claim 3, wherein the light guiding layer is formed in a core material having a refraction index nc, and the trenches are left containing air or are filled with an infill material with a refraction index nr less than the refraction index nc of the core material.

8. The photonic chip according to claim 3, wherein the substrate has a thickness Th, the light beam makes an angle Θ2 with an axis perpendicular to the front and back faces and the collimation structure has a centre and a median axis orthogonal to the front and back faces passing through its centre, the median axis of the collimation structure and an axis orthogonal to the front face and the back face passing through the centre of the vertical coupler being offset by a distance 2×Th*tan Θ2.

9. The photonic chip according to claim 1, wherein the collimation structure (14) is configured to extract light passing through it from the vertical coupler along the normal to the front or back face of the photonic chip.

10. The photonic chip according to claim 1, wherein the substrate is made of silicon, the light guiding layer is supported on a layer made of a dielectric material and an anti-reflection layer is interposed between the substrate and the layer made of a dielectric material.

11. A method of fabricating a photonic chip comprising a light guiding layer supported by a substrate and covered with an encapsulation layer, the photonic chip having a front face on the side of the encapsulation layer and a back face on the side of the substrate, the light guiding layer including a light guiding structure optically coupled to a vertical coupler configured to receive light from the waveguide and to form a light beam directed towards either the front face or the back face, the method including the formation of a collimation structure at least partly in the light guiding layer, and the formation of an arrangement of one or several reflecting structures each on one of the front and back faces, said arrangement being made so as to propagate light between the vertical coupler and the collimation structure along an optical path with at least one fold.

* * * * *

UNITED STATES PATENT AND TRADEMARK OFFICE
CERTIFICATE OF CORRECTION

PATENT NO. : 10,459,163 B2
APPLICATION NO. : 16/202682
DATED : October 29, 2019
INVENTOR(S) : Sylvie Menenzo Page 1 of 1

It is certified that error appears in the above-identified patent and that said Letters Patent is hereby corrected as shown below:

In the Specification

Column 12, formula (2) at bottom of page Should read:

$$W_{Si}(n,p) = 2P \cdot \sqrt{\frac{\left(\sqrt{\frac{\pi W_{Si}(0)^2 * n_{Si}^2 + (4P^2 - \pi W_{Si}(0)^2) * n_{SiO_2}^2}{4P^2}} - n_0 \frac{\sqrt{F^2 + (nP-X)^2 + (pP)^2} - \sqrt{F^2+X^2}}{h}\right)^2 - n_{SiO_2}^2}{\pi(n_{Si}^2 - n_{SiO_2}^2)}} \quad (2)$$

Column 16, Line 60-65 Should read:

$$\frac{cd\_min^2 \pi(n_{Si}^2 - n_{SiO_2}^2) + 4P^2 \cdot n_{SiO_2}^2}{4P^2}$$
$$= \left[\sqrt{\frac{\pi(P - cd\_min)^2 * n_{Si}^2 + (4P^2 - \pi(P - cd\_min)^2) * n_{SiO_2}^2}{4P^2}} - n_0 \frac{\left[\sqrt{F^2 + (nP-X)^2 + (pP)^2} - F\right]}{h}\right]^2$$

Signed and Sealed this
Second Day of June, 2020

Andrei Iancu
*Director of the United States Patent and Trademark Office*